United States Patent [19]
Cheek et al.

[11] Patent Number: 5,970,311
[45] Date of Patent: Oct. 19, 1999

[54] METHOD AND STRUCTURE FOR OPTIMIZING THE PERFORMANCE OF A SEMICONDUCTOR DEVICE HAVING DENSE TRANSISTORS

[75] Inventors: Jon Cheek, Round Rock; Daniel Kadosh; Derick J. Wristers, both of Austin, all of Tex.

[73] Assignee: Advanced Micro Devices, Austin, Tex.

[21] Appl. No.: 08/961,980

[22] Filed: Oct. 31, 1997

[51] Int. Cl.[6] .......................... H01L 21/00; H01L 21/66; G01R 31/26
[52] U.S. Cl. .................. 438/11; 438/18; 324/765
[58] Field of Search .................. 438/10, 11, 14, 438/17; 257/48; 324/765, 769

[56] References Cited

U.S. PATENT DOCUMENTS

| | | | |
|---|---|---|---|
| 5,304,925 | 4/1994 | Ebina | 324/719 |
| 5,598,010 | 1/1997 | Uematsu | 257/48 |
| 5,760,600 | 6/1998 | Kasai | 324/769 |

*Primary Examiner*—Brian Dutton
*Attorney, Agent, or Firm*—Merchant & Gould P.C.

[57] ABSTRACT

A method and structure for optimizing the performance of a semiconductor device having dense transistors. A method consistent with the present invention includes forming a first test structure on a first substrate portion. The first test structure includes a transistor having a gate electrode formed at a design width and at a first line spacing similar to the line spacing of a dense transistor. One or more electrical properties the transistor of the first test structure is measured. A second test structure is formed on a second substrate portion. The second test structure includes a transistor having a gate electrode formed at the same design width as the transistor of the first test structure and at a second line spacing greater than the first line spacing. One or more electrical properties of the transistor of the second test structure are measured. Using the measured one or more electrical properties, one or more relationships are developed between the measured one or more electrical properties and the transistors at the first line spacing and the second line spacing.

22 Claims, 4 Drawing Sheets

METHOD AND STRUCTURE FOR OPTIMIZING THE PERFORMANCE OF A SEMICONDUCTOR DEVICE HAVING DENSE TRANSISTORS

FIELD OF THE INVENTION

The present invention is directed generally to semiconductor devices and, more particularly, to a method and structure for optimizing the performance of a semiconductor device having dense transistors.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101 (which is typically formed of polysilicon) which acts as a conductor and to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a doping type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. The current flow through the channel region is typically referred to as the source-drain current. This type of device is commonly referred to as a MOS field-effect-transistors (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral dimensions of the device structure. As the device structure dimensions are reduced laterally, it also becomes necessary to scale down the vertical dimensions of the device.

Gate electrodes and the spacing between adjacent gate electrodes are important features which must be scaled down as the device structure is made smaller. Gate electrodes are typically formed by forming a layer of polysilicon over the substrate, masking the polysilicon layer, and removing unmasked portions of the polysilicon layer to form polysilicon lines. This is typically performed using well-known deposition and photolithography techniques. Each polysilicon line ("poly line") typically functions as one or more gate electrodes.

As the device structure is scaled down, the spacing between adjacent poly lines is decreased. Control over the characteristics of the poly lines and their associated transistors is reduced. For example, when etching closely spaced poly lines the resultant or actual width of the poly lines is typically smaller than the width specified by design specifications ("design width"). The differences between the design width and actual width of the poly lines can dramatically impact device performance. For example, electrical properties, such as drive currents, of the transistors associated with closely spaced poly lines can vary from design specifications.

The differences in poly line width is of significant concern in devices where adjacent poly lines are so densely packed that the electrical properties of the transistors associated with the dense poly lines cannot be measured directly. In these instances, the change in the electrical properties of the transistors cannot be taken into account during transistor design.

SUMMARY OF THE INVENTION

Generally, the present invention relates to a method and structure for optimizing the performance of a semiconductor device having dense transistors. Using the present invention, one or more relationships between one or more electrical properties of transistors and transistor density can be determined and device performance improved as compared to devices formed using conventional techniques.

Consistent with the present invention, a method is provided for determining one or more relationships between one or more electrical properties and transistor density. In accordance with this exemplary method, a first test structure is formed on a first substrate portion. The first test structure includes a transistor having a gate electrode formed at a design width and at a first line spacing similar to the line spacing of a dense transistor. One or more electrical properties the transistor of the first test structure is measured. A second test structure is formed on a second substrate portion. The second test structure includes a transistor having a gate electrode formed at the same design width as the transistor of the first test structure and at a second line spacing greater than the first line spacing. One or more electrical properties of the transistor of the second test structure are measured. Using the measured one or more electrical properties, one or more relationships are developed between the measured one or more electrical properties and the transistors at the first line spacing and the second line spacing. The first line spacing may, for example, be at the minimum line spacing. The second line spacing may, for example, be at 1.5 times the minimum line spacing.

In accordance with one aspect of the invention, a third test structure is formed on a third substrate portion. The third test structure includes a transistor having a gate electrode formed at the same design width as the two transistors above and formed at a third line spacing different than the first and second line spacings. The third line spacing may be relatively large such that the transistor can represent an isolated transistor. One or more electrical properties of the transistor of the third test structure are measured and used to develop the relationship(s) between the one or more electrical properties and the transistors of the first, second and third test structures. The relationship(s) may, for example, be used to adjust parameters of a fabrication process to optimize the performance of semiconductor devices formed using the fabrication process.

An exemplary test structure in accordance with an embodiment of the invention includes a test transistor having a gate electrode line disposed over a substrate. Two active regions are disposed in the substrate each adjacent to a respective side of the gate electrode. The test structure further includes two contact structures each electrically connected with a respective one of the active regions. Each of the contact structures is configured to allow one or more side lines to be disposed in the corresponding active region such that the side lines may be disposed at different lines spacings.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
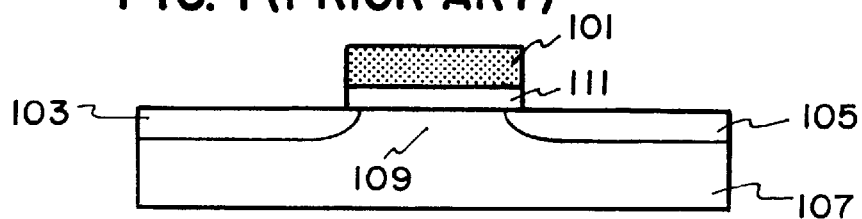
FIG. 1 illustrates components of a conventional MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices having dense transistors. The invention is particularly suited to semiconductor devices having transistor gate electrodes formed with poly lines. While the present invention is not so limited, an appreciation of various aspects of the invention is best gained through a discussion of an exemplary process and exemplary test structures used in accordance with the invention.

To simplify discussion of the drawings, certain terminology will now be defined. This terminology will be used in a consistent manner throughout the detailed description. The term line spacing will be used to refer to the spacing (i.e., distance) between adjacent poly lines. The term minimum spacing will be used to describe the smallest line spacing that may be formed between adjacent poly lines. The minimum spacing is dependent upon the processing techniques used and can vary between processing techniques.

The term dense transistor will be used to refer to a transistor having a gate electrode formed from a poly line which is sufficiently close to adjacent poly lines that the active regions (e.g., the source and drain regions) of the transistor cannot be contacted for measurement of the electrical properties of the transistor. Transistors formed at minimum spacing are typically dense transistors, while transistors formed at greater than minimum spacing may or may not be dense transistors. Typically, it becomes difficult to contact active regions of transistors at poly line spacing of about 1 micron or less. However, this threshold spacing can vary depending on the semiconductor structure and the process used for contacting the transistors.

The term density is used to refer to the amount of substrate area covered by poly lines on a given area of a substrate. The term design width is used to refer to the desired width of a transistor gate electrode as set by design specifications and typically is the width of the mask or reticle used to form the gate electrode. The actual width of a gate electrode can vary from its design width, for example, due to the spacing between the gate electrode and nearby poly lines.

Figure 2:
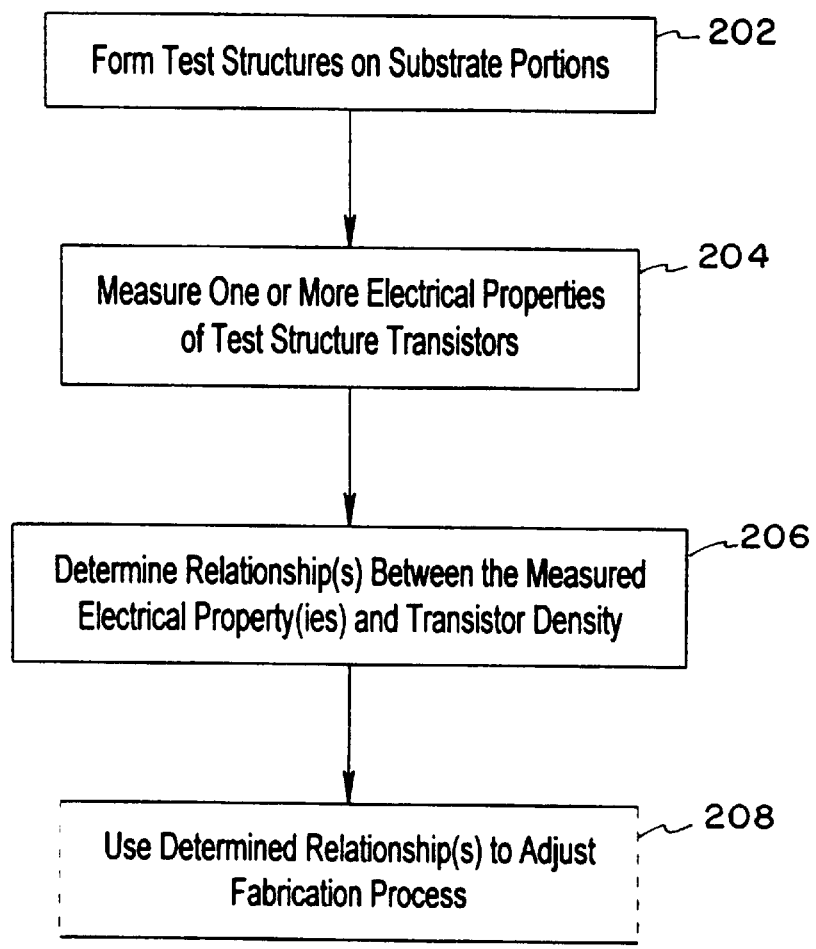
FIG. 2 is a flow chart illustrating an exemplary process in accordance with one embodiment of the invention.

FIG. 2 is a flow chart illustrating an exemplary process for determining one or more relationships between transistor density and one or more electrical properties of transistors. The process generally measures electrical properties of test transistors and uses the measured properties to adjust parameters of an associated process for fabricating actual or non-test transistors. In accordance with this exemplary process, multiple test structures are formed on substrate portions, as indicated at block 202. The substrate portions may be part of a common semiconductor substrate or may reside on different semiconductor substrates. Typically, the semiconductor substrate(s) are formed from silicon.

Each exemplary test structure includes a transistor having a gate electrode poly line formed at a particular design width and line spacing. The test transistor is used to represent an actual transistor of an associated fabrication process and is typically formed in a similar manner as the actual transistor. The design widths of the transistors of the various test structures are typically the same, while the density or line spacing at which the transistors are formed varies. For example, on a first test structure, a test transistor formed at minimum spacing (high density) and having a particular design width may be formed. On a second test structure, a test transistor formed at a greater line spacing (lower density), such as 1.5×minimum spacing, and having the same design width may be formed. On a third test structure, an isolated test transistor (low density) having no nearby poly lines and the same design width may be formed. Exemplary test structures and the fabrication thereof will be discussed more fully below.

With each test structure, one or more electrical properties of the associated transistor are measured, as indicated at block 204. The measured electrical properties may, for example, include the effective drive current ($Id_{eff}$) and the off-state drive current ($Id_{off}$) of the particular transistor. The electrical properties are typically measured using known techniques. Exemplary measurement techniques are discussed below.

The measured electrical properties are then used to develop one or more relationships between transistor density and the electrical properties, as indicated at block 206. For example, by measuring the $Id_{off}$ of transistors at different densities, a relationship between $Id_{off}$ and transistor density may be determined.

As indicated at block 208, the relationship(s) between the one or more electrical properties and transistor density may be used in the fabrication of semiconductor devices. For example, a fabrication process used to form a semiconductor device may be adjusted based on the observed relationship between an electrical property and transistor density. For example, the design width of poly lines formed at minimum spacing can be adjusted such that the electrical properties of transistors with such poly lines can be more closely matched with the expected electrical properties based on design specifications.

The number of test structures that are used (and the number of different density transistors that are used) is selected in consideration of the desired accuracy of the developed relationships. Typically, three or more test structures are used. For purposes of illustration, three exemplary test structures and the processes for fabrication thereof will be described with reference to FIGS. 3–5.

Figure 3:
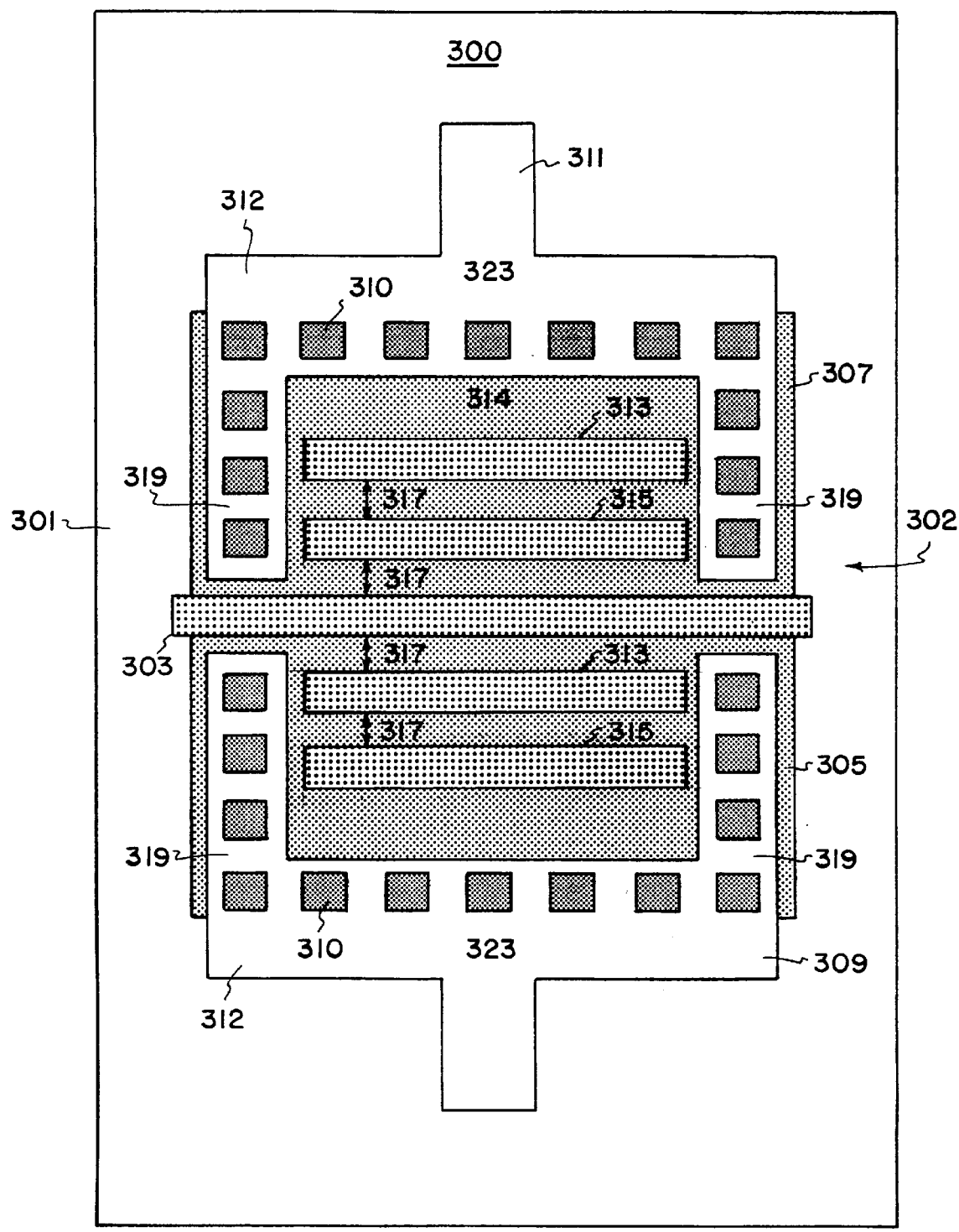
FIGS. 3–5 illustrate three exemplary test structures for use in one embodiment of the invention.

In FIG. 3, there is illustrated a test structure 300 having a transistor 302 representative of a dense transistor. The transistor 302 generally includes a gate electrode poly line 303 formed over a portion 301 of a substrate and two active regions 305 and 307 each formed in the substrate portion 301 and adjacent a side of the gate electrode line 303. The active regions 305 and 307 will operate as source/drain regions of the transistor 302. A contact structure 309 is electrically coupled to the active region 305 and a second contact structure 311 is in electrical contact with the active region 307. The contact structures 309 and 311 are coupled with a measurement system (not shown) for measuring the electrical properties of the transistor 302.

In the example test structure 300, two poly lines 313 and 315 are disposed adjacent each side of the gate electrode line 303. The poly lines 313 and 315 are left floating (i.e., not electrically coupled), while the gate electrode line 303 is coupled to an electrical source. The spacing 317 between gate electrode line 303 and the poly lines 313 and 315 is typically similar to the line spacing of dense transistors so that the transistor 302 represents a dense transistor. The spacing 317 may, for example, be the minimum spacing.

The contact structures 309 and 311 generally contact the respective active regions 305 and 307 near the gate electrode 303 of the transistor 302. The contact structures typically include a number of contacts 310 which extend down from a conductive layer 312 to the active regions 305 and 307. In the example embodiment, each contact structure 309 and 311 includes a pair of legs 319 running perpendicular to the gate electrode 303 and having ends near the gate electrode 303. The other ends of the legs 319 are interconnected by a cross member 323 which typically runs parallel to the gate electrode 303. The illustrated layout of the contact structures 309 and 311 allows the contacts 310 to contact a significant portion of the active regions 305 and 307. Preferably the amount of the active regions 305 and 307 which are contacted is maximized to provide more accurate measurement of the electrical properties of the transistor 302.

The layout of the contact structures 309 and 311 is configured to allow the poly lines 313 and 315 to be disposed within areas 314 defined between the contact structures 309 and 311 and gate electrode line 303. As will be discussed below, in the other test structures, the layout of the contact structures and defined areas is similar. This eliminates variability between the test structures due to variations in the contact structure. As other test structures will, for example, have poly lines which are spaced further apart than the minimum spacing, the contact structures are designed to accommodate such spacing. Accordingly, the distance between the gate electrode 303 and cross member 323 is typically sufficiently wide to accommodate a similar number of side poly lines spaced at a larger line spacing.

The test structure 300 may be formed using a number of different known techniques. The particular fabrication process is preferably similar to the fabrication process used to form the actual or non-test semiconductor devices. One exemplary process of forming the test structure 300 will be described for purposes of illustration only. In accordance with this fabrication process, the gate electrode 303 and poly lines 313 and 315 are formed over the substrate portion 301. This typically includes forming a thin gate oxide layer over the substrate surface, depositing a layer of polysilicon over the gate oxide layer, and selectively removing portions of the polysilicon to form the gate electrode 303 and poly lines 313 and 315 from the remaining portions of the polysilicon layer.

The substrate is then masked to selectively expose a portion of the substrate where the active regions 305 and 307 will be formed. The exposed portions of the substrate are then implanted with a dopant, such as boron or arsenic, to form the active regions 305 and 307. In some embodiments, spacers may be formed on the sidewalls of the gate electrode 303 and the poly lines 313 and 315 prior to and/or after implanting the dopant into the active regions 305 and 307. A metal silicide is then formed over the active regions 305 and 307 using, for example, known techniques.

A dielectric layer, such as a layer of silicon dioxide, is then formed over the substrate and selectively removed to form openings to the active regions 305 and 307. The openings will be used to form the contacts 310. A conductive layer, typically a metal such as tungsten or aluminum, is then formed over the dielectric layer and selectively removed to form the conductive layer 312 and contacts 310 of contact structures 309 and 311. Alternatively, the contacts 310 and conductive layer 312 may be formed separately.

Figure 4:
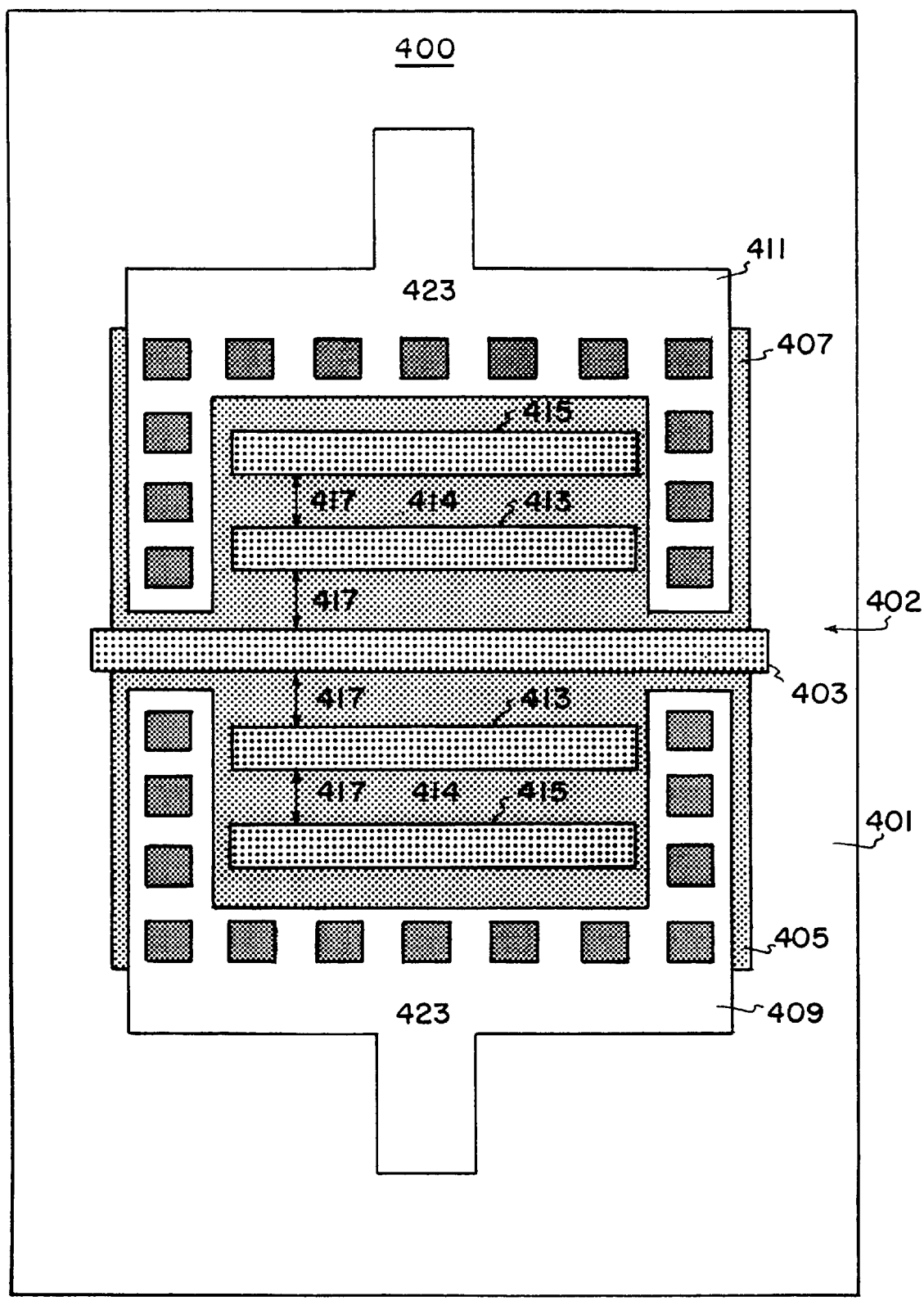

In FIG. 4, there is illustrated a test structure having a transistor formed at a greater line spacing than the transistor 302 above. The test structure 400 generally includes a transistor 402 having a gate electrode line 403 formed over a portion 401 of a substrate and two active regions 405 and 407 each formed in the substrate portion 401 and adjacent a side of the gate electrode line 403. The gate electrode 403 is formed at the same design width as gate electrode 303 above. A contact structure 409 is electrically coupled to the active region 405 and a second contact structure 411 is in electrical contact with the active region 407. The active regions 405 and 407 operate as source/drain regions. The contact structures 409 and 411 are coupled with a measurement system (not shown) for measuring the electrical properties of the transistor 402.

In the example test structure 400, two poly lines 413 and 415 are disposed adjacent each side of the gate electrode line 403. The spacing 417 between the gate electrode 403 and the poly lines 413 and 415 is greater than the spacing 317 of the first test structure 300. For example, the spacing 417 may be 1.5 times minimum spacing. This provides a non-dense transistor which may be electrically measured using a similar test structure as a dense transistor.

The contact structures 409 and 411 have the same configuration as those described above with respect to FIG. 3 and have the same physical relationship with respect to the gate electrode 403 as the contact structures 309 and 311 have to the gate electrode 303 at FIG. 3. As illustrated in FIG. 4, less room exists between the outside poly line 415 and the cross member 423, due to the increased spacing 417 between the gate electrode 403 and the poly lines 413 and 415.

The test structure 400 may be formed in a similar manner as the test structure 300. It should be appreciated that due to the different spacing 417 between the poly lines 413 and 415 and gate electrode 403, the active regions 405 and 407 will have a somewhat different pattern than the active regions 305 and 307 of the test structure 300. However, by using contact structures having similar physical relationships and which contact significant portions of the active regions, variability (e.g. variability in resistivity) due to the different active region patterns is minimized. In addition, by siliciding the active regions prior to forming the contact structures, this variability is further reduced.

Figure 5:
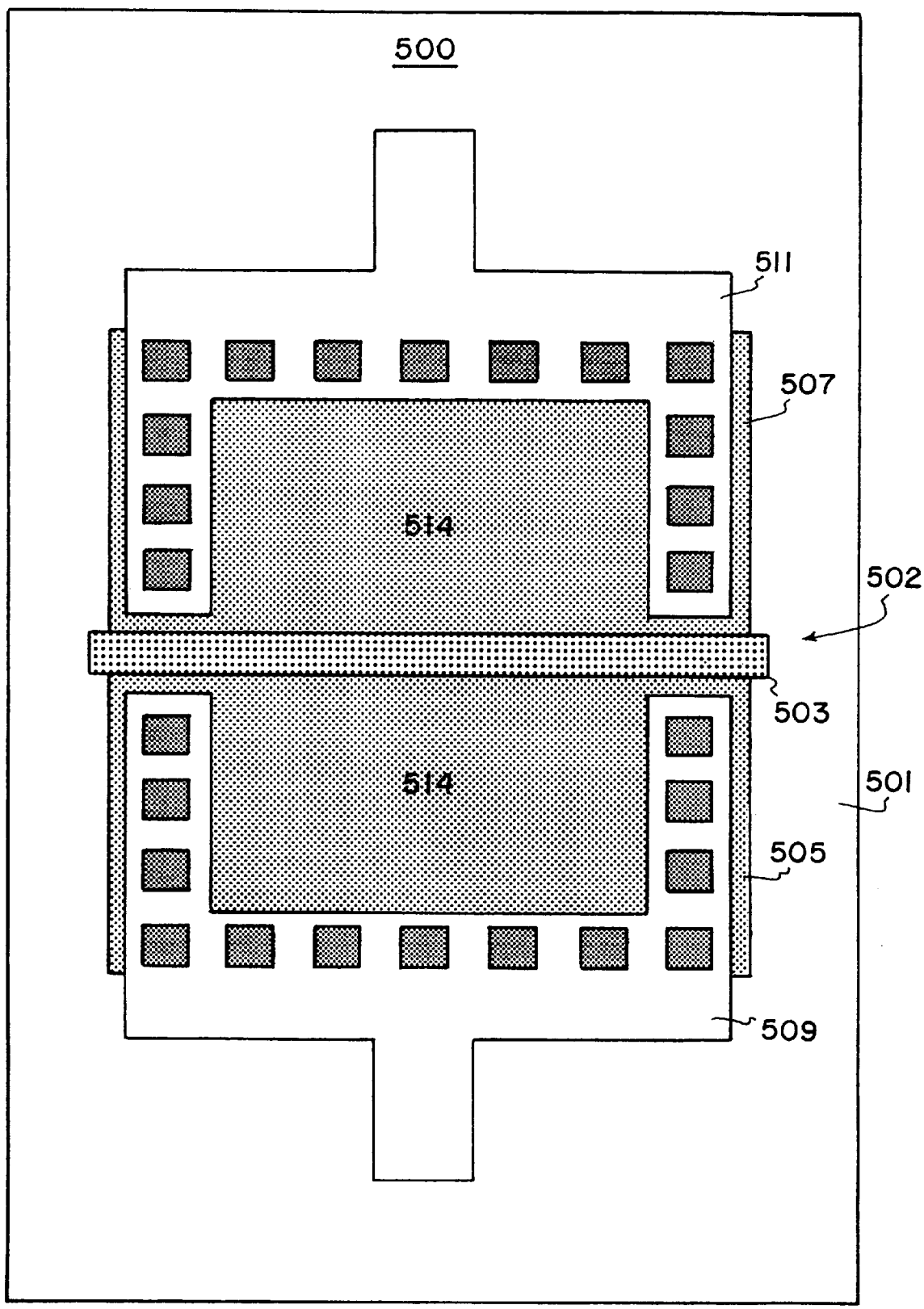

In FIG. 5, there is illustrated a test structure having an isolated transistor. The test structure 500 generally includes a transistor 502 having a gate electrode line 503 formed over a portion 501 of a substrate and two active regions 505 and 507 each formed in the substrate portion 501 and adjacent a side of the gate electrode line 503. A contact structure 509 is electrically coupled to the active region 505 and a second contact structure 511 is in electrical contact with the active region 507. The contact structures 509 and 511 are coupled with a measurement system (not shown) for measuring the electrical properties of the transistor 502.

In the example test structure 500, no poly lines are formed in the areas 514 defined between the contact structures 509 and 511 and the gate electrode line 503. This provides a test structure 500 which represents an isolated transistor. The contact structures 509 and 511 have the same configuration as those described above with respect to FIGS. 3 and 4 and have the same physical relationship with respect to the gate electrode 503 as the contact structures and gate electrodes described above in FIGS. 3 and 4.

The test structure 500 may also be formed in a similar manner as the test structures 300 and 400 above. It should be appreciated that due to the absence of poly lines adjacent the gate electrode 503, the active regions 505 and 507 will have a different pattern than the active regions of the test structures 300 and 400 above. However, by using contact structures having similar physical relationships and which contact significant portions of the active regions, variability (e.g. variability in resistivity) due to the different active region patterns is minimized. In addition, by siliciding the active regions prior to forming the contact structures, this variability is further minimized.

The three test structures 300, 400 and 500 may be used with the process of FIG. 2 in order to develop relationship(s) between transistor density and one or more electrical transistor properties. For example, the effective drive current $Id_{eff}$ and the off-state drive current $Id_{off}$ may be measured for each of the transistors 302, 402 and 502 of the test structures 300, 400 and 500 respectively. The effective drive current $Id_{eff}$ of a transistor may, for example, be determined using well-known techniques, such as measuring the source-drain current of the transistor while applying a known voltage to the gate and the drain, and grounding the source of the transistor, and dividing the source-drain current by the transistor width. The transistor width may, for example, be the length of the poly gate electrode over its respective active area. The off-state current $Id_{off}$ of a transistor may, for example, be determined using well-known techniques, such as measuring the source-drain current of the transistor while applying a known voltage to the drain of the transistor and grounding the gate and source of the transistor.

Using the measured $Id_{eff}$ and $Id_{off}$ currents, a relationship between each of these currents and transistor density may be developed. For example, each measured current may be plotted against the density or line spacing of the respective transistor and from this plotting, a curve may be fit to the data to develop a relationship between each measured current and transistor density. Using these relationships, the parameters of a fabrication process may be modified to incorporate the observed relationship(s). For example, the polygate mask (i.e., the mask or reticle which defines the design width of a gate electrode), threshold voltage implants, source/drain implants, etc. may be modified. In this manner, the performance of semiconductor devices having dense transistors can be optimized.

The physical layout of the test structures 300–500 plays an important role in providing accuracy for the determined relationship(s) between electrical properties and transistor density. For example, as noted above, by using contact structures having similar physical relationships and which contact significant portions of the active regions, variability due to different active region patterns is minimized. Moreover, by forming a metal silicide over the active regions prior to forming the contact structures, this variability is further reduced.

While in the above described embodiments, the gate electrode lines (and the lines adjacent thereto if any) are formed from polysilicon, the invention is not so limited. The gate electrode lines (and lines adjacent thereto) may be formed from other materials including, for example, metals such as tungsten or aluminum. In addition, while two side lines are shown adjacent the gate electrodes, the invention is not so limited. More than two side lines or just one side line may be disposed adjacent the gate electrodes, if desired. Moreover, while the illustrated test structures are symmetric about the gate electrode line, the invention is not so limited. What is important is that between test structures, the contact structures and gate electrode lines have relatively similar configurations to reduce variability in testing.

The present invention is applicable to fabrication of a number of different semiconductor devices having dense transistors. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A method of forming a test structure for use in determining a relationship between a transistor electrical property and transistor density, comprising:

forming a gate electrode line over a substrate;

forming two active regions in the substrate, each active region being disposed adjacent a respective side of the gate electrode line;

forming two contact structures each electrically connected to a respective one of the active regions and each being positioned to allow one or more side lines to be formed in each of respective active regions at different spacings.

2. The method of claim 1, wherein forming the contact structure includes forming first and second legs each having a first and near the gate electrode line a second end connected to a cross member, the first and second legs in the cross member defining an area of the respective active region in which the one or more side lines may be disposed.

3. The method of claim 2, further including forming at least a first and second side line in each area defined by one of the contact structures, the first side line being spaced apart from the gate electrode line by a minimum width and the second side line being spaced apart from the first side line by the minimum width.

4. The method of claim 1, further including forming at least a first and a second side line in each area defined by one of the contact structures, the first side line being spaced apart from the gate electrode line by a width greater than a minimum width and the second side line being spaced apart from the first side line by the width.

5. A method of determining one or more relationships between one or more electrical properties and transistors density, comprising:

forming a first test structure on a first substrate portion, the first test structure including a transistor having a gate electrode formed at a design width and a first line spacing;

measuring a first one or more electrical properties of the transistor of the first test structure;

forming a second test structure on a second substrate portion, the second test structure including a transistor having a gate electrode formed at the design width and at a second line spacing greater than the first line spacing;

measuring a second one or more electrical properties of the transistor of the second test structure;

developing one or more relationships between transistor electrical properties and transistor line spacing using the measured first and second one or more electrical properties the first line spacing and the second line spacing.

6. The method of claim 5, wherein forming the first test structure includes:

forming a first group of lines over the first substrate portion, the lines having the first line spacing therebetween, a central one line of the first group of lines functioning as the gate electrode of the first test structure;

forming a first pair of active regions in the first substrate portion, each active region being formed adjacent a side of the central one line and in regions of the first substrate portion between the first group of lines; and forming a first pair of contact structures each in electrical connection with a respective one of the first pair of active regions.

7. The method of claim 6, wherein forming the second test structure includes:

forming a second group of lines over the second substrate portion, the second group of lines having the second line spacing therebetween, a central one line of the second group of lines functioning as the gate electrode of the second test structure;

forming a second pair of active regions in the second substrate portion, each of the second pair of active regions being formed adjacent a side of the central one line of the second group of lines and in regions of the second substrate portion between the second group of lines; and forming a second pair of contact structures each in electrical connection with a respective one of the second pair of active regions.

8. The method of claim 7, wherein the first pair of contact structures is disposed in a first physical relationship relative to the gate electrode of the first test structure and the second pair of contact structures is disposed in a second physical relationship relative to the gate electrode of the second test structure;

wherein the first and second physical relationships are substantially identical.

9. The method of claim 8, further including;

forming a third test structure on a third substrate portion, the third test structure including a transistor having a gate electrode formed at the design width and at a third line spacing than the first and the second line spacing; and measuring third one or more electrical properties of the transistor of the third test structure;

wherein developing the one or more relationships includes using the measured third one or more electrical properties of the transistor of the third test structure.

10. The method of claim 9, wherein forming the third test structure includes:

forming an isolated line which functions as the gate electrode of the third test structure;

forming a third pair of active regions free of polylines in the third substrate portion, each of the third pair of active regions being formed adjacent a side of the isolated line; and forming a third pair of contact structures each in electrical connection with a respective one of the third pair of active regions.

11. The method of claim 10, wherein the third pair of contact structures is disposed in a third first physical relationship relative to the gate electrode of the third test structure, the third physical relationship being substantially identical to the first and second physical relationships.

12. The method of claim 5, further including;

forming a third test structure on a third substrate portion, the third test structure including a transistor having a gate electrode formed at the design width and at a third line spacing different than the first and the second line spacing; and measuring a third one or more electrical properties of the transistor of the third test structure;

wherein developing the one or more relationships includes using the measured third one or more electrical properties of the transistor of the third test structure.

13. The method of claim 5, further including using the one or more relationships to adjust one or more characteristics of a subsequently formed semiconductor device.

14. The method of claim 5, wherein the first substrate portion and second substrate portion are part of a common substrate.

15. The method of claim 5, wherein the gate electrode of the first and second test structures are made of polysilicon.

16. A method of determining a transistor electrical property to density relationship, comprising:

forming a first test structure on a first substrate portion, the first test structure including a transistor having a gate electrode formed at a design width and a first density;

measuring at least one electrical property of the transistor of the first test structure;

forming a second test structure on a second substrate portion, the second test structure including a transistor having a gate electrode formed at the design width and a second density different than the first density;

measuring at least one electrical property of the transistor of the second test structure;

developing the transistor electrical property to density relationship using the measured at least one electrical property of the transistor of the first test structure and the measured at least one electrical property of the transistor of the second test structure and the first density and the second density.

17. The method of claim 16, wherein forming the first test structure includes:

forming, over the first substrate portion, a first group of lines having a first line spacing, the first group of lines including a central one line functioning as the gate electrode of the first test structure and one or more side lines disposed adjacent respective sides of the central one line;

forming, in the first substrate portion a first pair of active regions, each active region being formed adjacent a side of the central one line, each active region being disposed around the one or more side lines adjacent the respective side of the central one line; and forming a first pair of contact structures each in electrical connection with a respective of one of the first pair of active regions, each contact structure surrounding the one or more side lines of a respective side of the central one line.

18. The method of claim 17, wherein forming the second test structure includes:

forming, over the second substrate portion, a second group of lines having a second line spacing, the second group of lines including a central one line functioning as the gate electrode of the second test structure and one or more side lines disposed adjacent respective sides of the central one line of the second group of lines;

forming, in the second substrate portion, a second pair of active regions, each of the second pair of active regions being formed adjacent a side of the central one line of the second group of lines, each of the second pair of active regions being disposed around the one or more side lines adjacent the respective side of the central one line of the second group of lines; and forming a second pair of contact structures each in electrical connection with a respective of one of the second pair of active regions, each of the second pair of contact structures surrounding the one or more side lines of a respective side of the central one line of the second group of lines.

19. The method of claim 18, wherein the first pair of contact structures is disposed in a first physical relationship relative to the gate electrode of the first test structure and the second pair of contact structures is disposed in a second physical relationship relative to the gate electrode of the second test structure, wherein the first and second physical relationships are substantially identical.

20. A method of forming a semiconductor structure for use in determining a relationship between a transistor electrical property and transistor density, comprising:

forming a first transistor on a first substrate portion, the first transistor having a first gate electrode formed at a design width and a first line spacing and two active regions disposed adjacent respective sides of the first gate electrode;

forming a first set of contact structures each electrically connected to a respective one of the active regions of the first transistor;

forming a second transistor on a second substrate portion, the second transistor having a second gate electrode formed at the design width and at a second line spacing different than the first line spacing and having two active regions disposed adjacent respective sides of the second gate electrode; and forming a second set of contact structures each electrically connected to a respective of the active regions of the second transistor, wherein the first set of contact structures has a physical relationship with respect to first gate electrode similar to a physical relationship of the second set of contact structures with respect to the second gate electrode.

21. The method of claim 20, wherein forming the first test transistor includes forming a first group of lines over thy first substrate portion, the first group of lines having the first line spacing therebemteen, a central one line of the first group of lines functioning as the gate electrode of the first transistor.

22. The method of claim 20, wherein forming the second test transistor includes forming a second group of lines over the second substrate portion, the second group of lines having the second line spacing therebetween, a central one line of the second group of lines functioning as the gate electrode of the second transistor.

* * * * *